United States Patent
Lee et al.

(10) Patent No.: US 9,136,002 B2
(45) Date of Patent: Sep. 15, 2015

(54) SEMICONDUCTOR MEMORY DEVICES UTILIZING RANDOMIZATION AND DATA PROGRAMMING METHODS THEREOF

(71) Applicants: Yongkyu Lee, Hwaseong-si (KR); BoGeun Kim, Suwon-si (KR)

(72) Inventors: Yongkyu Lee, Hwaseong-si (KR); BoGeun Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/242,406

(22) Filed: Apr. 1, 2014

(65) Prior Publication Data

US 2014/0313835 A1     Oct. 23, 2014

(30) Foreign Application Priority Data

Apr. 17, 2013 (KR) ........................ 10-2013-0042320

(51) Int. Cl.
| | |
|---|---|
| *G11C 16/04* | (2006.01) |
| *G11C 16/10* | (2006.01) |
| *G11C 11/56* | (2006.01) |
| *G11C 16/34* | (2006.01) |
| *G11C 7/02* | (2006.01) |
| *G11C 7/10* | (2006.01) |

(52) U.S. Cl.
CPC ........... *G11C 16/10* (2013.01); *G11C 7/02* (2013.01); *G11C 7/1006* (2013.01); *G11C 11/5628* (2013.01); *G11C 16/3418* (2013.01)

(58) Field of Classification Search
CPC .......... G11C 16/10; G11C 16/30; G11C 16/12
USPC ........... 365/185.18, 185.12, 185.09; 711/103, 711/154
See application file for complete search history.

(56) References Cited

U.S. PATENT DOCUMENTS

| | | | |
|---|---|---|---|
| 7,461,327 B2 | 12/2008 | Kim et al. | |
| 7,877,615 B2 | 1/2011 | Sohn | |
| 8,208,326 B1 | 6/2012 | Solt et al. | |
| 2004/0225835 A1 | 11/2004 | Coulson | |
| 2009/0172266 A1 | 7/2009 | Kimura | |
| 2010/0217921 A1* | 8/2010 | Mun | 711/103 |
| 2011/0161678 A1 | 6/2011 | Niwa | |
| 2012/0215963 A1* | 8/2012 | Kim et al. | 711/103 |
| 2012/0287719 A1* | 11/2012 | Mun et al. | 365/185.18 |
| 2013/0173989 A1* | 7/2013 | Chung et al. | 714/763 |
| 2013/0176785 A1* | 7/2013 | Chen et al. | 365/185.12 |
| 2014/0010017 A1* | 1/2014 | Lee et al. | 365/185.18 |

* cited by examiner

*Primary Examiner* — Connie Yoha
(74) *Attorney, Agent, or Firm* — Myers Bigel Sibley & Sajovec, P.A.

(57) ABSTRACT

A data programming method of a semiconductor memory device is provided which includes randomizing write data using a randomization method selected from among a plurality of randomization methods according to whether the write data is programmed in one of a plurality of nonvolatile memories; and programming the randomized write data in at least one of the plurality of nonvolatile memories, wherein the plurality of nonvolatile memories has different types from one another.

20 Claims, 14 Drawing Sheets

SEMICONDUCTOR MEMORY DEVICES UTILIZING RANDOMIZATION AND DATA PROGRAMMING METHODS THEREOF

CROSS-REFERENCE TO RELATED APPLICATIONS

A claim for priority under 35 U.S.C. §119 is made to Korean Patent Application No. 10-2013-0042320 filed Apr. 17, 2013, in the Korean Intellectual Property Office, the entire contents of which are hereby incorporated by reference.

FIELD

Embodiments of the inventive concepts described herein relate to semiconductor memory devices, and more particularly, relate to semiconductor memory devices capable of randomizing data programmed in a nonvolatile memory and a data programming method thereof.

BACKGROUND

A semiconductor memory is volatile or nonvolatile according to its operating characteristic. The volatile memory is a memory that loses data stored therein at power-off. The nonvolatile memory retains data stored therein even at power-off. Therefore, the nonvolatile memory is used to store contents to be retained regardless of whether a power is supplied.

A flash memory is a typical nonvolatile semiconductor memory device capable of implementing high integration and mass storage and is applied to a handheld electronic device. Other nonvolatile memories include a Phase-change Random Access Memory (PRAM) using a phase change material as a nonvolatile element suitable for a random access and for large capacity and high integration and a Magnetic RAM (MRAM) using a magnetic element. The PRAM and the MRAM may belong to a resistive RAM in that data stored in a memory cell is read out by measuring a resistance value between both ends of the memory cell. Operating speeds of the PRAM and the MRAM are faster than that of the flash memory.

In recent years, a semiconductor memory device that is formed of different types of nonvolatile memories (e.g., a NAND flash memory, a PRAM, an MRAM, etc.) has been researched to improve the performance of a nonvolatile semiconductor memory device. However, different types of nonvolatile memories use different data storing methods and different management methods.

SUMMARY

Some embodiments of the inventive concept are provide a data programming method of a semiconductor memory device, comprising randomizing write data using one randomization method selected from among a plurality of randomization methods according to whether the write data is programmed in any one of a plurality of nonvolatile memories; and programming the randomized write data in at least one of the plurality of nonvolatile memories, wherein the plurality of nonvolatile memories has different types from one another.

In some embodiments, each of the randomization methods generates random sequences using randomizers having different degrees.

In some embodiments, each of the randomization methods uses different seed generating methods to generate a seed for data to be randomized.

In some embodiments, minimum program units of the plurality of nonvolatile memories are different from one another.

In some embodiments, the plurality of nonvolatile memories comprises a variable resistance random access memory configured to determine data stored in a memory cell by reading a resistance value between both ends of the memory cell. In some embodiments, the variable resistance random access memory is a phase-change random access memory. In some embodiments, the plurality of nonvolatile memories comprises a NAND flash memory.

Some embodiments of the inventive concept provide a data programming method of a semiconductor memory device that includes different types of first and second nonvolatile memories, the data programming method comprising randomizing first write data using at least one randomization method selected from among a plurality of randomization methods according to an attribute of the first write data to be programmed in the first nonvolatile memory; and programming the randomized first write data in the first nonvolatile memory. Second write data to be programmed in the second nonvolatile memory is randomized using a predetermined randomization method of the plurality of randomization methods.

In some embodiments, the randomizing comprises randomizing the first write data using a randomization method, different from the predetermined randomization method, from among the plurality of randomization methods when the first write data has an attribute of metadata.

In some embodiments, the randomizing comprises randomizing the first write data using the predetermined randomization method when the first write data has an attribute of buffer data, and the buffer data is data that is temporarily stored in the first nonvolatile memory to move the first write data to the second nonvolatile memory.

In some embodiments, each of the randomization methods generates random sequences using randomizers having different degrees.

In some embodiments, each of the randomization methods uses different seed generating methods to generate a seed for data to be randomized.

In some embodiments, the first nonvolatile memory is a variable resistance random access memory configured to determine data stored in a memory cell by reading a resistance value between both ends of the memory cell. In some embodiments, the first nonvolatile memory is a phase-change random access memory.

In some embodiments, the second nonvolatile memory comprises a NAND flash memory.

In some embodiments, a data programming method of a semiconductor memory device includes randomizing first write data using a first randomization method selected from among a first plurality of randomization methods configured for nonvolatile memories with a first minimum programming unit and programming the randomized first write data in a first nonvolatile memory when the first write data is programmed in the first nonvolatile memory having the first minimum programming unit. The method further includes randomizing second write data using a second randomization method selected from among a second plurality of randomization methods configured for nonvolatile memories with a second minimum programming unit and programming the randomized second write data in a second nonvolatile memory when the second write data is programmed in the second nonvolatile memory having the second minimum programming unit lower than the first minimum programming unit.

In some embodiments, the first plurality of randomization methods generates random sequences using randomizers having a higher degree than randomizers of the second plurality of randomization methods, wherein a degree of a randomizer corresponds to a number of circularly connected shift registers of the randomizer. The method may also include generating a seed of a randomizer of the second plurality of randomization methods based on a combination of column and row addresses of the second write data.

In some embodiments, the first nonvolatile memory comprises a NAND flash memory and the second nonvolatile memory comprises a variable resistance random access memory configured to determine data stored in a memory cell by reading a resistance value between both ends of the memory cell. The second nonvolatile memory may be at least one of a magnetic random access memory (MRAM), phase-change random access memory (PRAM) and resistive random access memory (ReRAM).

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
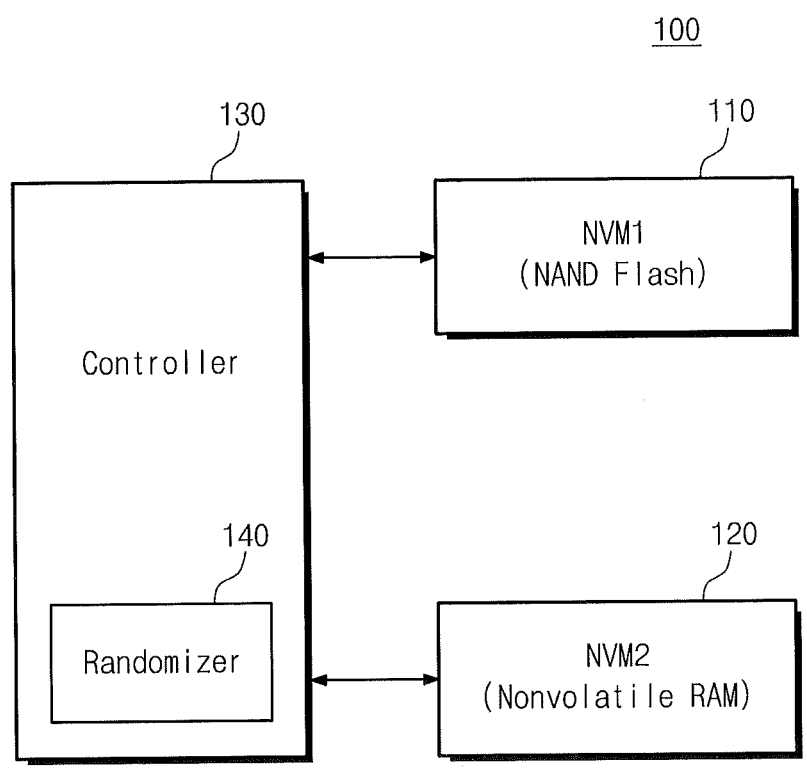
FIG. 1 is a block diagram schematically illustrating a semiconductor memory device according to an embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Embodiments described herein provide for controlling different types of nonvolatile memories efficiently. FIG. 1 is a block diagram schematically illustrating a semiconductor memory device according to an embodiment of the inventive concept. Referring to FIG. 1, a semiconductor memory device 100 includes a first nonvolatile memory 110, a second nonvolatile memory 120, and a controller 130. In FIG. 1, there is illustrated an embodiment where the semiconductor memory device 100 includes two different types of nonvolatile memories 110 and 120. However, the inventive concept is not limited thereto. For example, the semiconductor memory device 100 may further comprise a nonvolatile memory (not shown) that has the same type of that of the first nonvolatile memory 110 or the second nonvolatile memory 120.

The controller 130 includes a randomizer 140.

The first nonvolatile memory 110 receives and stores write data according to a control of the controller 130. The first nonvolatile memory 110 may be a nonvolatile memory of a particular type. For example, the first nonvolatile memory 110 may be a NAND flash memory.

A type of the second nonvolatile memory 120 is different from that of the first nonvolatile memory 110. For example, in the event that the first nonvolatile memory 110 is a NAND flash memory, the second nonvolatile memory 120 is a variable resistance random access memory such as a phase-change RAM, a resistive RAM, a magnetoresistive RAM, etc. The second nonvolatile memory 120 receives and stores write data according to a control of the controller 130.

The controller 130 controls the first and second nonvolatile memories 110 and 120. The controller 130 includes the randomizer 140 configured to randomize write data to be programmed in the first or second nonvolatile memories 110 or 120.

The randomizer 140 randomizes write data. Here, data randomization may mean that data bits are rearranged such that program states of memory cells to be programmed with data are uniformly distributed. For example, a memory cell may have one of $2^N$ threshold voltage distributions (N indicating the number of data bits stored in a memory cell) according to the amount of charges stored in its charge storing means. A threshold voltage (or, a threshold voltage distribution) of a memory cell may be variable by coupling caused between adjacent memory cells. This coupling may be referred to as word line coupling. The coupling may increase when program states of memory cells are irregularly distributed. Thus, the randomizer 140 may reduce the coupling between memory cells by making program states of memory cells programmed with write data become more uniform.

The semiconductor memory device 100 randomizes write data using one of a plurality of different randomization methods according to whether write data is programmed in any nonvolatile memory (or, a type of nonvolatile memory in which write data is stored).

For example, a randomization method is optimized according to a type of nonvolatile memory in which write data is stored. Since data is programmed in the NAND flash memory by a page unit, a minimum unit of data to be programmed is relatively large. On the other hand, a minimum unit of data to be programmed in a nonvolatile random access memory (e.g., a PRAM) is small. In general, a small size of data (e.g., metadata) is programmed in the nonvolatile random access memory.

A randomization method suitable for the NAND flash memory is different from that suitable for the PRAM. For example, a data randomization effect may be reduced when data randomized using a randomization method suitable for a memory (e.g., a NAND flash memory), the minimum program unit of which is large, is stored in a memory (e.g., a PRAM) for which the minimum program unit is small. Thus, it is efficient to randomize write data using a randomization method appropriate for a type of each nonvolatile memory.

Here, randomization methods may be distinguishable in a degree of the randomizer 140. For example, for a better randomization performance, write data to be programmed in a memory (e.g., a NAND flash memory), the minimum program unit of which is large, is randomized according to a random sequence generated using a relatively higher degree randomizer. On the other hand, write data to be programmed in a memory (e.g., a PRAM), the minimum program unit of which is small, is randomized according to a random sequence generated using a relatively lower degree randomizer.

Also, randomization methods may be distinguishable in a seed generating method for randomization. For example, in a NAND flash memory programmed by a page unit, a seed for data randomization is generated according to a page address. If a seed generated according to a page address is applied to a memory (e.g., a PRAM), the minimum program unit of which is small, program states (or threshold voltages) of memory cells arranged in a row direction are irregularly distributed. Thus, memory cells connected to a word line of the PRAM are divided into a plurality of groups, and the memory cells are programmed by a group unit. Thus, it is more effective to generate a random seed based on a combination of column and row addresses of write data.

The semiconductor memory device 100 randomizes write data using one of a plurality of randomization methods distinguishable according to a degree of the randomizer 140 or a seed generating method.

The randomizer 140, a random sequence, a seed, and a data randomizing method will be more fully described with reference to FIG. 2.

In some embodiments, the semiconductor memory device 100 randomizes write data using one of a plurality of randomization methods according to an attribute of write data. For example, in the event that the second nonvolatile memory 120 is used as a buffer memory of the first nonvolatile memory 110, write data programmed in the second nonvolatile memory 120 may be moved into the first nonvolatile memory 110. In this case, overhead of an overall program operation is reduced by randomizing write data using a randomization method suitable for a type of main memory (i.e., a type of first nonvolatile memory 110). Thus, randomness of data programmed in the main memory is improved.

Alternatively, in the event that write data has an attribute of metadata, it may be randomized using a randomization method suitable for the second nonvolatile memory 120. It is assumed that a relatively large size of user data is stored in the first nonvolatile memory 110 and a relatively small size of metadata is stored in the second nonvolatile memory 120. If write data has an attribute of metadata, it may be stored in the second nonvolatile memory 120, while it is not moved to the first nonvolatile memory 110. In this case, a performance of randomization is thus improved by randomizing data using a randomization method suitable for the second nonvolatile memory 120.

In a semiconductor memory device including different types of nonvolatile memories, write data is randomized using at least one randomization method selected from among different randomization methods according to write data and a type of nonvolatile memory in which the write data is to be programmed. Thus, a performance of randomization of the semiconductor memory device 100 is improved.

Figure 2:
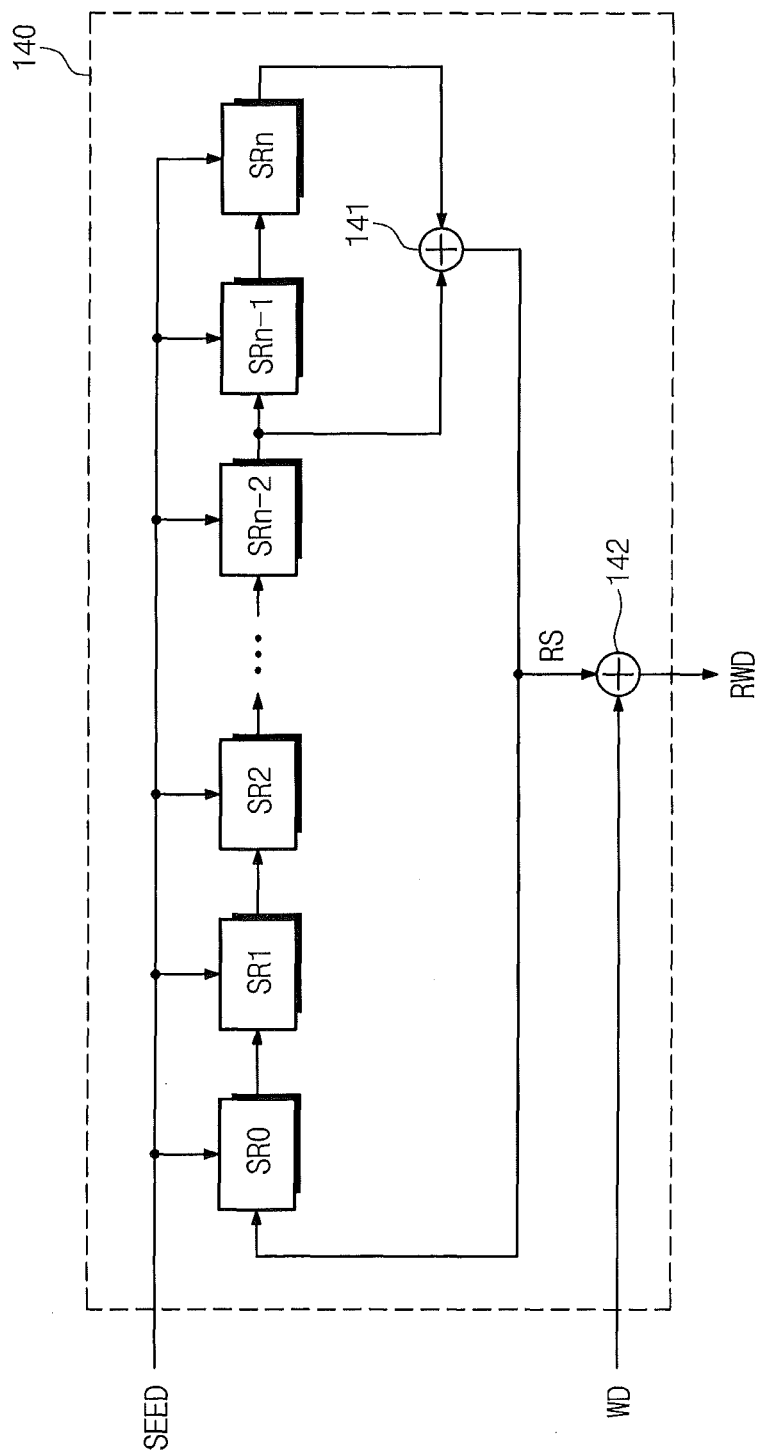
FIG. 2 is a block diagram schematically illustrating a randomizer illustrated in FIG. 1, according to an embodiment of the inventive concept.

FIG. 2 is a block diagram schematically illustrating a randomizer illustrated in FIG. 1, according to an embodiment of the inventive concept. Referring to FIG. 2, a randomizer 140 includes a plurality of shift registers SR1 to SRn and logic gates 141 and 142.

When the number of shift registers SR1 to SRn is n, a random sequence has a period of $(2^n-1)$. Here, 'n' may mean a degree of the randomizer 140. Also, an initial value is provided to each of the shift registers SR1 to SRn as a seed. In some embodiments, the seed may be provided from a seed generator (not shown).

Referring to FIG. 2, the first logic gate 141 generates a random sequence RS by performing an XOR operation on bits from the shift registers SRn−2 and SRn. The second logic gate 142 generates randomized write data RWD by randomizing write data WD using the random sequence RS thus generated. In some embodiments, the second logic gate 142 generates randomized write data RWD by performing an XOR operation on the write data WD and the random sequence RS sequentially.

The randomizer 140 may include a plurality of hardware corresponding to different randomization methods such that a semiconductor memory device 100 performs the different randomization methods. Or, the randomizer 140 may include single general-purpose hardware and perform different randomization methods by controlling the single general-purpose hardware differently.

As described above, the randomizer 140 may rearrange input data such that a bit distribution (i.e., distributions of '1' bits and '0' bits or sequential arrangement) of an output data pattern is constantly maintained. This randomization operation may reduce interference between memory cells programmed with data, and the reliability of data of a semiconductor memory device is improved.

FIGS. 3 to 7 are flow charts schematically illustrating program methods according to embodiments of the inventive concept. In FIGS. 3 to 7, there are provided various program methods including various data randomization operations.

Figure 3:
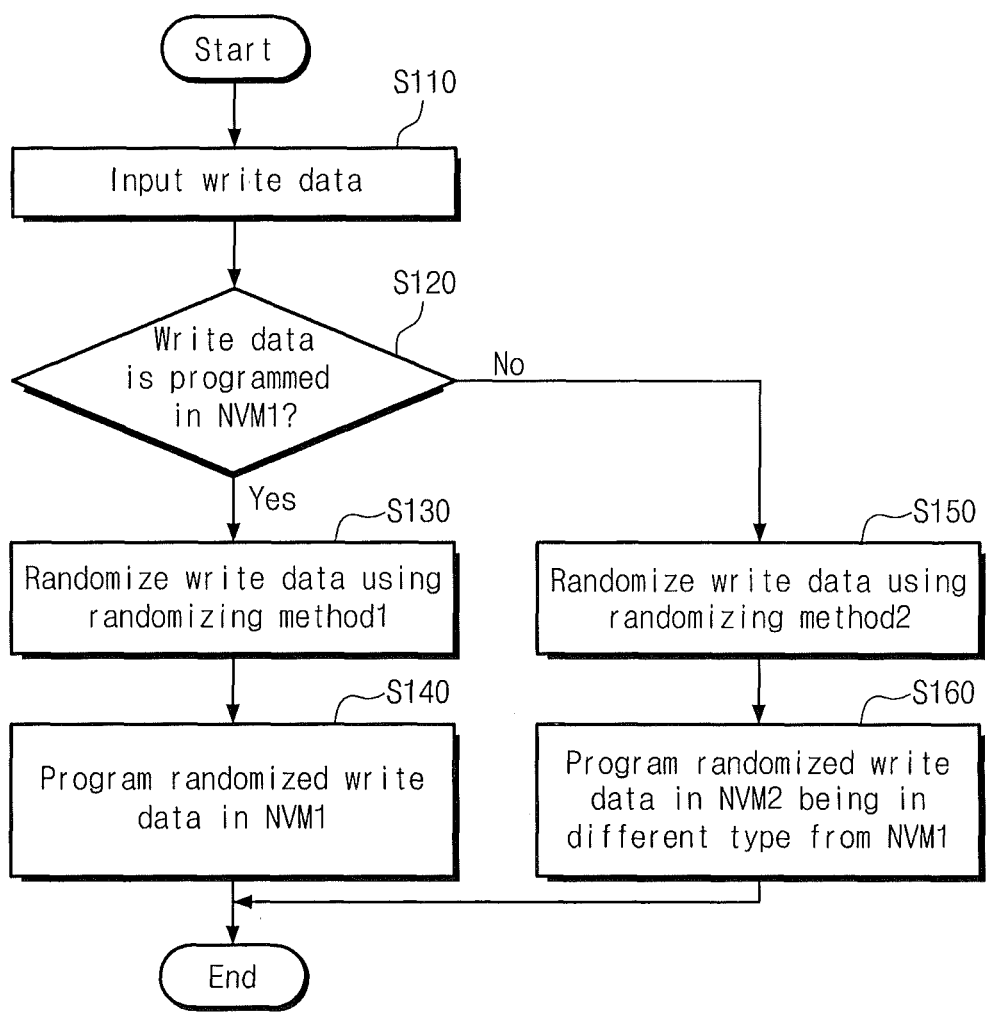
FIGS. 3 to 7 are flow charts schematically illustrating program methods according to embodiments of the inventive concept.

FIG. 3 is a flow chart schematically illustrating a program method according to an embodiment of the inventive concept. In FIG. 3, there is illustrated a method in which a semiconductor memory device 100 (refer to FIG. 1) randomizes write data and programs the randomized data.

In step S110, write data is provided to a controller 130 (refer to FIG. 1) of the semiconductor memory device 100. The write data may be provided from an external host or from another storage device of the semiconductor memory device 100.

In steps S120 to S160, the semiconductor memory device 100 randomizes write data using at least one randomization method selected from among a plurality of randomization methods according to whether the write data is to be programmed in any one of a plurality of nonvolatile memories. And, randomized write data may be programmed in one of the plurality of nonvolatile memories.

In particular, in step S120, the semiconductor memory device 100 determines whether the write data is to be programmed in a first nonvolatile memory 110 (refer to FIG. 1). If so, the method proceeds to step S130. If not, the method proceeds to step S150.

In step S130, the semiconductor memory device 100 randomizes the write data using a first randomization method. Here, the first randomization method may be a randomization method optimized/suitable for a memory (e.g., the first nonvolatile memory 110), the minimum program unit of which is relatively large. After the write data is randomized, the method proceeds to step S140.

In step S140, the semiconductor memory device 100 programs the randomized write data in the first nonvolatile memory 110. Afterwards, the method ends.

Returning to step S120, in the event that the write data is not programmed in the first nonvolatile memory 110, the method proceeds to step S150.

In step S150, the semiconductor memory device 100 randomizes the write data using a second randomization method. Here, the second randomization method may be a randomization method optimized/suitable for a memory in which the minimum program unit is relatively small. A degree of a randomizer or a seed generating method of the second randomization method is different from that of the first randomization method. After the write data is randomized, the method proceeds to step S160.

In step S160, the semiconductor memory device 100 programs the randomized write data in a second nonvolatile memory 120. Afterwards, the method ends.

Figure 4:
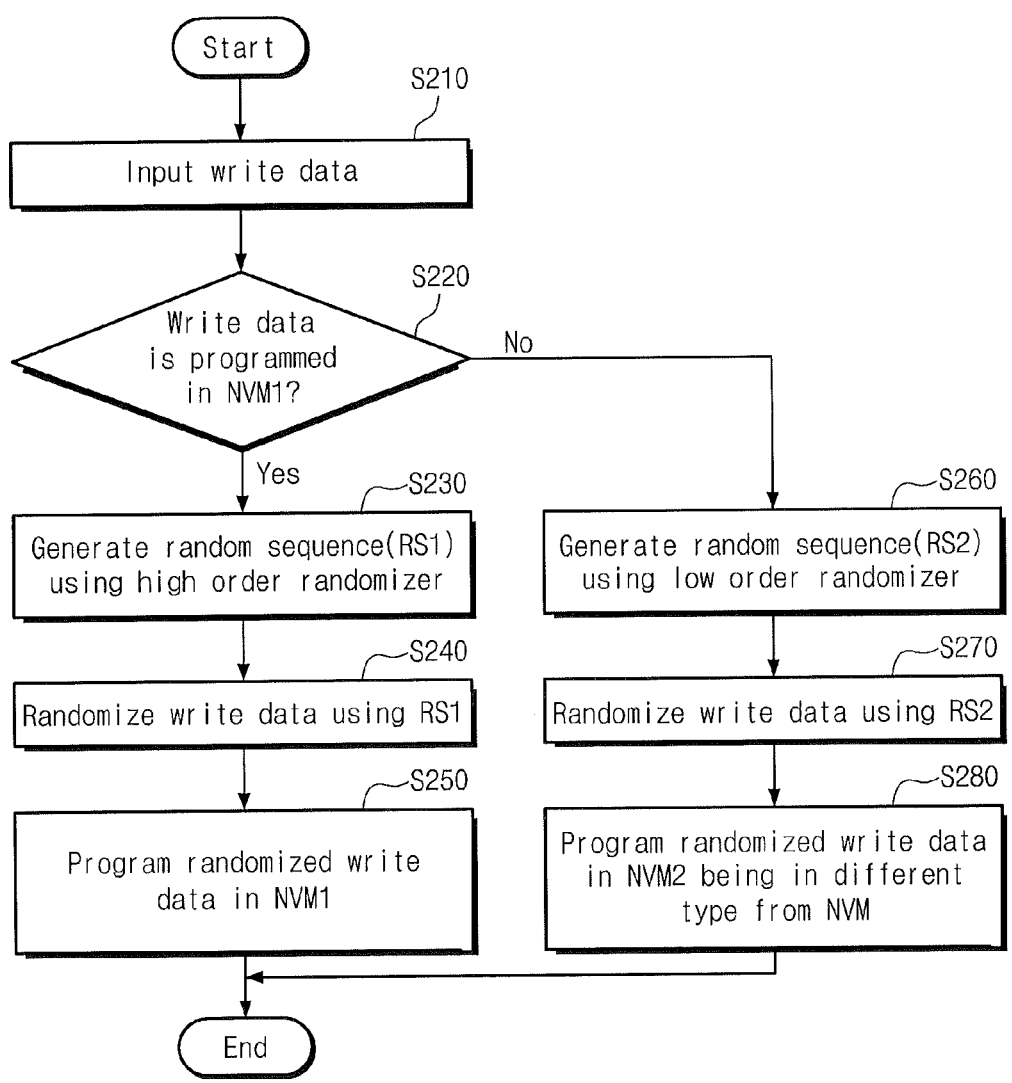

FIG. 4 is a flow chart schematically illustrating a program method according to another embodiment of the inventive concept. In FIG. 4, there is illustrated a method in which a semiconductor memory device 100 (refer to FIG. 1) randomizes write data and programs the randomized data.

In step S210, write data is provided to a controller 130 (refer to FIG. 1) of the semiconductor memory device 100. The write data may be provided from an external host or from another storage device of the semiconductor memory device 100.

In steps S220 to S280, the semiconductor memory device 100 randomizes write data using at least one method selected from among a plurality of randomization methods according to whether the write data is to be programmed in any one of a plurality of nonvolatile memories. And, randomized write data may be programmed in one of the plurality of nonvolatile memories.

In particular, in step S220, the semiconductor memory device 100 determines whether the write data is to be programmed in a first nonvolatile memory 110 (refer to FIG. 1). If the write data is data to be programmed in the first nonvolatile memory 110, the method proceeds to step S230. If the write data is data to be programmed in a second nonvolatile memory 120, the method proceeds to step S260.

In step S230, the semiconductor memory device 100 generates a random sequence RS1 for randomization using a relatively higher degree randomizer 140 (refer to FIG. 1). Here, a degree of the randomizer 140 may mean the number of shift registers of the randomizer 140 circularly connected to one another. The randomizer 140 with a relatively higher degree is suitable to randomize a large size of data. A method of generating the random sequence RS1 using the randomizer 140 is substantially the same as that described with reference to FIG. 2. After the random sequence RS1 is generated, the method proceeds to step S240.

In step S240, the semiconductor memory device 100 randomizes the write data using the random sequence RS1 thus generated. In particular, the semiconductor memory device 100 performs an XOR operation on the write data and the random sequence RS1 to output a resultant value as randomized write data. A method in which the semiconductor memory device 100 randomizes the write data using the random sequence RS1 is substantially the same as that described with reference to FIG. 2. After the write data is randomized, the method proceeds to step S250.

In step S250, the semiconductor memory device 100 programs the randomized write data in the first nonvolatile memory 110. Afterwards, the method ends.

Returning to step S220, in the event that the write data is not programmed in the first nonvolatile memory 110, the method proceeds to step S260.

In step S260, the semiconductor memory device 100 generates a random sequence RS2 for randomization using a relatively lower degree randomizer 140. Here, a degree of the randomizer 140 may mean the number of shift registers of the randomizer 140 circularly connected to one another. The randomizer 140 with a relatively lower degree is suitable to randomize a small size of data. A method of generating the random sequence RS2 using the randomizer 140 is substantially the same as that described with reference to FIG. 2. After the random sequence RS2 is generated, the method proceeds to step S270.

In step S270, the semiconductor memory device 100 randomizes the write data using the random sequence RS2 thus generated. In particular, the semiconductor memory device 100 performs an XOR operation on the write data and the random sequence RS2 to output a resultant value as randomized write data. A method in which the semiconductor memory device 100 randomizes the write data using the random sequence RS2 is substantially the same as that described with reference to FIG. 2. After the write data is randomized, the method proceeds to step S280.

In step S280, the semiconductor memory device 100 programs the randomized write data in the second nonvolatile memory 120. Afterwards, the method ends.

Figure 5:
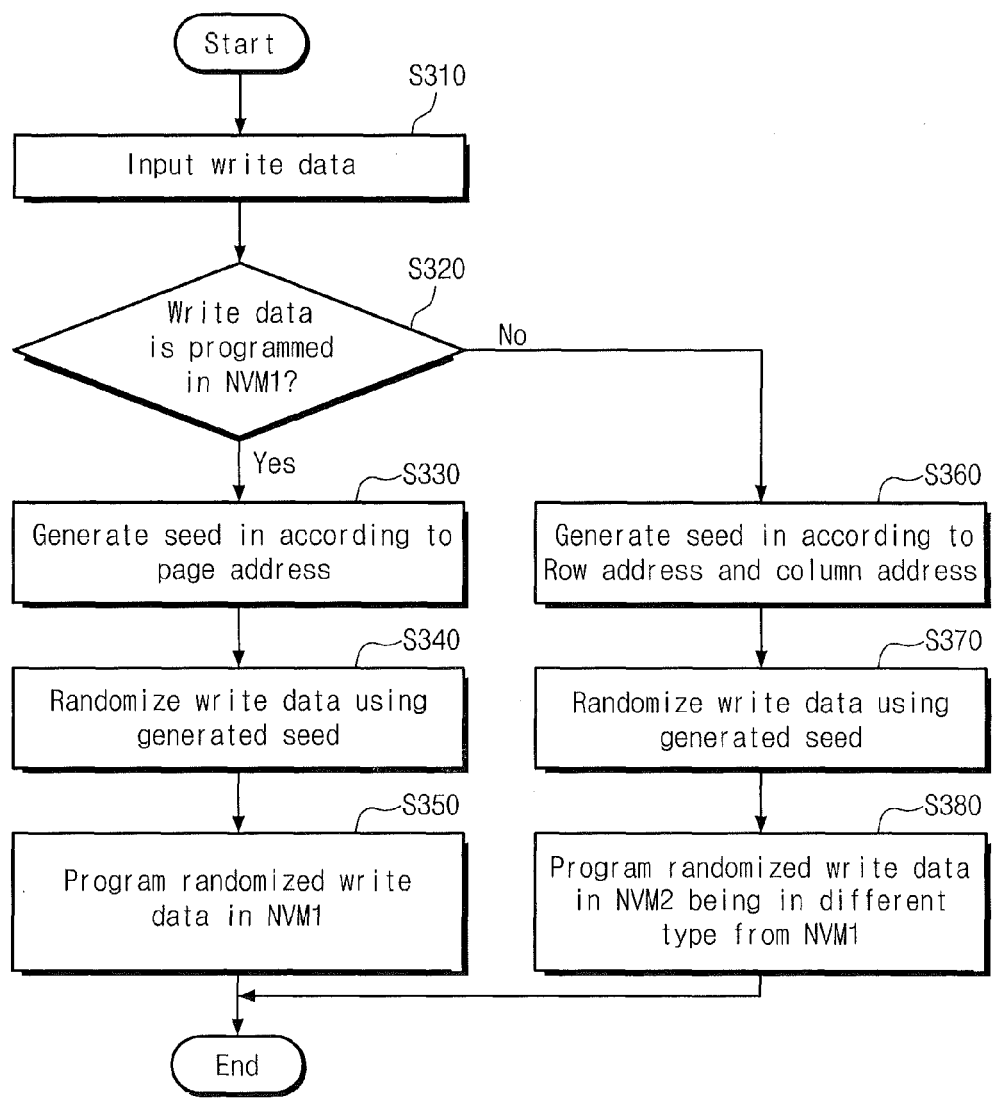

FIG. 5 is a flow chart schematically illustrating a program method according to still another embodiment of the inventive concept. In FIG. 5, there is illustrated a method in which a semiconductor memory device 100 (refer to FIG. 1) randomizes write data and programs the randomized data.

In step S310, write data is provided to a controller 130 (refer to FIG. 1) of the semiconductor memory device 100. The write data may be provided from an external host or from another storage device of the semiconductor memory device 100.

In steps S320 to S380, the semiconductor memory device 100 randomizes write data using at least one method selected from among a plurality of randomization methods according to whether the write data is to be programmed in any one of a plurality of nonvolatile memories. And, randomized write data may be programmed in one of the plurality of nonvolatile memories.

In particular, in step S320, the semiconductor memory device 100 determines whether the write data is to be programmed in a first nonvolatile memory 110 (refer to FIG. 1). If the write data is data to be programmed in the first nonvolatile memory 110, the method proceeds to step S330. If the write data is data to be programmed in a second nonvolatile memory 120, the method proceeds to step S360.

In step S330, the semiconductor memory device 100 generates a seed for randomization using a page address of the write data. Here, the seed may be provided to a randomizer 140 (refer to FIG. 1) as an initial value to be stored in shift registers of the randomizer 140. The seed generated using the page address is suitable to randomize data that is programmed by a page unit. After the seed is generated, the method proceeds to step S340.

In step S340, the semiconductor memory device 100 randomizes the write data using the seed thus generated. In particular, the semiconductor memory device 100 generates a random sequence using the seed and performs an XOR operation on the write data and the random sequence. The resultant value of the XOR operation is output as randomized write data. A method in which the semiconductor memory device 100 randomizes the write data using the seed and the random sequence is substantially the same as that described with reference to FIGS. 1 and 2. After the write data is randomized, the method proceeds to step S350.

In step S350, the semiconductor memory device 100 programs the randomized write data in the first nonvolatile memory 110. Afterwards, the method ends.

Returning to step S320, in the event that the write data is not programmed in the first nonvolatile memory 110, the method proceeds to step S360.

In step S360, the semiconductor memory device 100 generates a seed for randomization using a combination of row and column addresses of the write data. Here, the seed may be provided to a randomizer 140 (refer to FIG. 1) as an initial value to be stored in shift registers of the randomizer 140. In the event that the seed generated using a combination of row and column addresses of the write data is used, randomization may be performed uniformly in a row direction and a column direction. Thus, the seed is suitable for randomizing a relatively small size of data. After the seed is generated, the method proceeds to step S370.

In step S370, the semiconductor memory device 100 randomizes the write data using the seed thus generated. In particular, the semiconductor memory device 100 generates a random sequence using the seed and performs an XOR operation on the write data and the random sequence. The resultant value of the XOR operation is output as randomized write data. A method in which the semiconductor memory device 100 randomizes the write data using the seed and the random sequence is substantially the same as that described with reference to FIGS. 1 and 2. After the write data is randomized, the method proceeds to step S380.

In step S380, the semiconductor memory device 100 programs the randomized write data in the second nonvolatile memory 120. Afterwards, the method ends.

Figure 6:
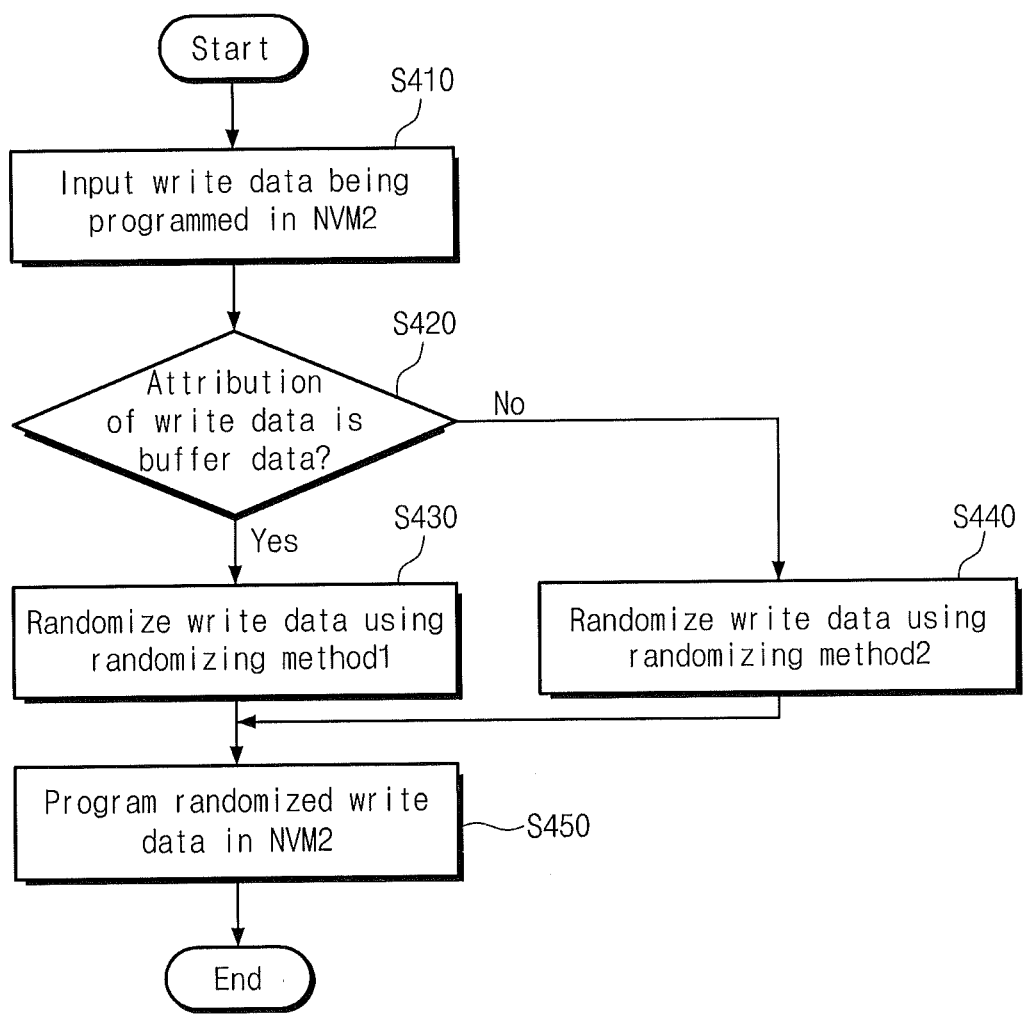

FIG. 6 is a flow chart schematically illustrating a program method according to another embodiment of the inventive concept. In FIG. 6, there is illustrated a method in which a semiconductor memory device 100 (refer to FIG. 1) randomizes write data and programs the randomized data. In particular, there is illustrated such a method that in the event that write data is programmed in a second nonvolatile memory 120 (refer to FIG. 1) having a minimum program unit relatively smaller than that of a first nonvolatile memory 110 (refer to FIG. 1), a semiconductor memory device 100 (refer to FIG. 1) randomizes write data and programs the randomized data. In some embodiments, it is assumed that the second nonvolatile memory 120 is used as a buffer memory of the first nonvolatile memory 110.

In step S410, write data is provided to a controller 130 (refer to FIG. 1) of the semiconductor memory device 100. The write data is data to be programmed in the second nonvolatile memory 120. The write data may be provided from an external host or from another storage device of the semiconductor memory device 100.

In steps S420 to S450, the semiconductor memory device 100 randomizes write data using at least one randomization method selected from among a plurality of randomization methods according to whether the write data is to be programmed in any one of a plurality of nonvolatile memories. The randomized data is programmed in the second nonvolatile memory 120.

In step S420, the semiconductor memory device 100 determines whether the write data has an attribute of buffer data. Here, the buffer data means data that is temporarily stored in a buffer memory (e.g., the second nonvolatile memory 120) to be moved to a main memory (e.g., the first nonvolatile memory 110). If the write data has an attribute of the buffer data, the method proceeds to step S430. If the write data does not have an attribute of the buffer data, the method proceeds to step S440.

In step S430, since the write data has an attribute of the buffer data, the write data is first programmed in the second nonvolatile memory 120, and then is moved to the first nonvolatile memory 110. At this time, if the write data is randomized whenever it is programmed in each of the first and second nonvolatile memories 110 and 120, excessive overhead may arise at a program operation. Thus, the semiconductor memory device 100 randomizes the write data once. In some embodiments, the semiconductor memory device 100 randomizes the write data using a randomization method suitable for a type of a main memory (e.g., the first nonvolatile memory 110) in which the write data is finally programmed. Since a time needed to store the write data in the main memory is longer than that needed to store it in the buffer memory, randomization on the main memory is more important than that on the buffer memory. Thus, when the write data has an attribute of the buffer data, the semiconductor memory device 100 randomizes the write data using a randomization method suitable for a memory (e.g., the first nonvolatile memory 110), the minimum program unit of which is relatively large. At this time, the randomization method used is distinguishable from other randomization methods in terms of a degree of a randomizer or a seed generating method. For example, a method of randomizing the buffer data comprises generating a seed using a page address, generating a random sequence by applying the generated seed to a higher degree randomizer, and randomizing data using the random sequence thus generated. A detailed description of a randomization method not described herein is substantially the same as described above. After randomization is completed, the method proceeds to step S450.

Retuning to step S420, if the write data does not have an attribute of the buffer memory (e.g., it is metadata), the method proceeds to step S440.

In step S440, since the write data does not have an attribute of the buffer data, the write data is finally programmed in the second nonvolatile memory 120, and then is moved to the first nonvolatile memory 110. Thus, the semiconductor memory device 100 randomizes the write data in the second nonvolatile memory 120 considering only randomness. In particular, the semiconductor memory device 100 randomizes the write data using such a randomization method that a minimum program unit is suitable for the second nonvolatile memory 120. At this time, the randomization method used is distinguishable from other randomization methods in terms of a degree of a randomizer or a seed generating method. For example, the semiconductor memory device 100 generates a seed using a combination of row and column addresses of the write data, generating a random sequence by applying the generated seed to a lower degree randomizer, and randomizing data using the random sequence thus generated. A detailed description of a randomization method not described herein is substantially the same as described above. After randomization is completed, the method proceeds to step S450.

In step S450, the semiconductor memory device 100 programs the randomized write data in the second nonvolatile memory 120. Afterwards, the method ends.

Figure 7:
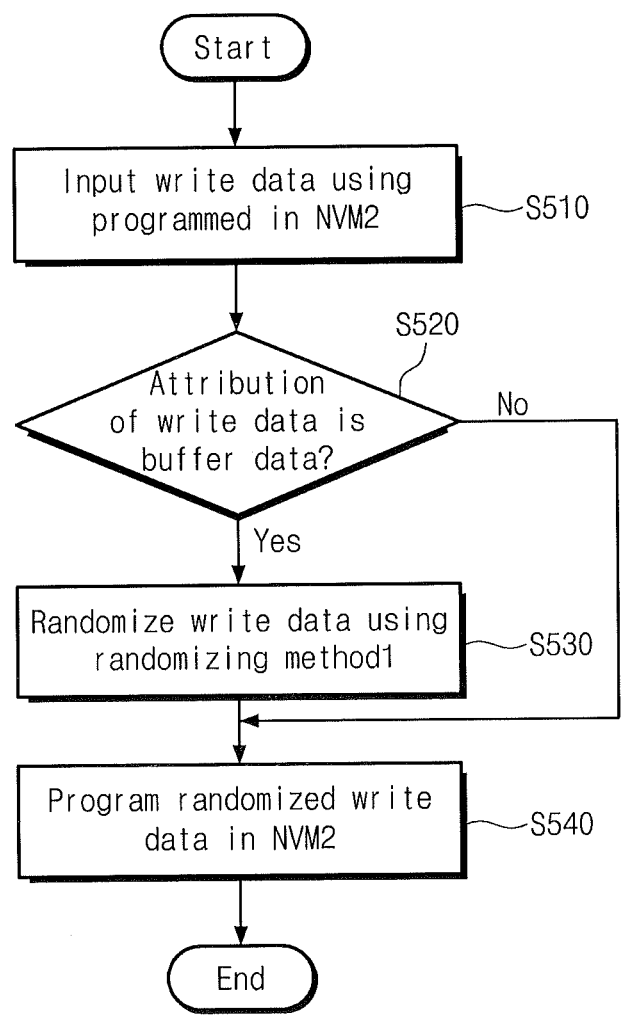

FIG. 7 is a flow chart schematically illustrating a program method according to a further embodiment of the inventive concept. In FIG. 7, there is illustrated a method in which a semiconductor memory device 100 (refer to FIG. 1) randomizes write data and programs the randomized data. In particular, there is illustrated such a method that in the event that write data is programmed in a second nonvolatile memory 120 (refer to FIG. 1) having a minimum program unit relatively smaller than that of a first nonvolatile memory 110 (refer to FIG. 1), a semiconductor memory device 100 (refer to FIG. 1) randomizes write data and programs the randomized data. In some embodiments, it is assumed that the second nonvolatile memory 120 is used as a buffer memory of the first nonvolatile memory 110.

In step S510, write data is provided to a controller 130 (refer to FIG. 1) of the semiconductor memory device 100. The write data is data to be programmed in the second nonvolatile memory 120. The write data may be provided from an external host or from another storage device of the semiconductor memory device 100.

In steps S520 and S530, the semiconductor memory device 100 selectively randomizes write data according to an attribute of the write data. The write data is programmed in the second nonvolatile memory 120.

In step S520, the semiconductor memory device 100 determines whether the write data has an attribute of buffer data. Here, the buffer data means data that is temporarily stored in a buffer memory (e.g., the second nonvolatile memory 120) to be moved to a main memory (e.g., the first nonvolatile memory 110). If the write data has an attribute of the buffer data, the method proceeds to step S530. If the write data does not have an attribute of the buffer data, the method proceeds to step S540.

In step S530, since the write data has an attribute of the buffer data, the write data is first programmed in the second nonvolatile memory 120, and then is moved to the first nonvolatile memory 110. Thus, the semiconductor memory device 100 randomizes the write data. In some embodiments, the semiconductor memory device 100 randomizes the write data using a randomization method suitable for a type of a main memory (e.g., the first nonvolatile memory 110) in which the write data is finally programmed. Since a time needed to store the write data in the main memory is longer than that needed to store it in the buffer memory, randomization on the main memory is more important than that on the buffer memory. Thus, when the write data has an attribute of the buffer data, the semiconductor memory device 100 randomizes the write data using a randomization method suitable for a memory (e.g., the first nonvolatile memory 110) the minimum program unit of which is relatively large. At this time, the randomization method used is distinguishable from other randomization methods in terms of a degree of a randomizer or a seed generating method. For example, a method of randomizing the buffer data comprises generating a seed using a page address, generating a random sequence by applying the generated seed to a higher degree randomizer, and randomizing data using the random sequence thus generated. A detailed description of a randomization method not described herein is substantially the same as described above. After randomization is completed, the method proceeds to step S540.

Returning to step S520, if the write data does not have an attribute of the buffer data (e.g., it is metadata), the method proceeds to step S540 without randomization on the write data. Since the write data does not have an attribute of the buffer data, it is finally programmed in the second nonvolatile memory 120. Meanwhile, a demand on data randomization of a nonvolatile random access memory (e.g., a PRAM, etc.) may not be higher than that of a NAND flash memory. Thus, in the event that the write data is programmed in the second nonvolatile memory 120 (i.e., when the write data does not have an attribute of buffer data), the method proceeds to step S540 without randomization on the write data to reduce power consumption by randomization and de-randomization operations.

In step S540, the semiconductor memory device 100 programs the randomized write data in the second nonvolatile memory 120. Afterwards, the method ends.

With program methods of the inventive concept, a semiconductor memory device including different types of nonvolatile memories is configured such that write data is randomized using at least one method selected from among a plurality of randomization methods according to an attribute of the write data and a type of a nonvolatile memory in which the write data is to be programmed. Thus, a performance of randomization of the semiconductor memory device 100 is improved so that the reliability of the semiconductor memory device 100 is improved.

Figure 8:
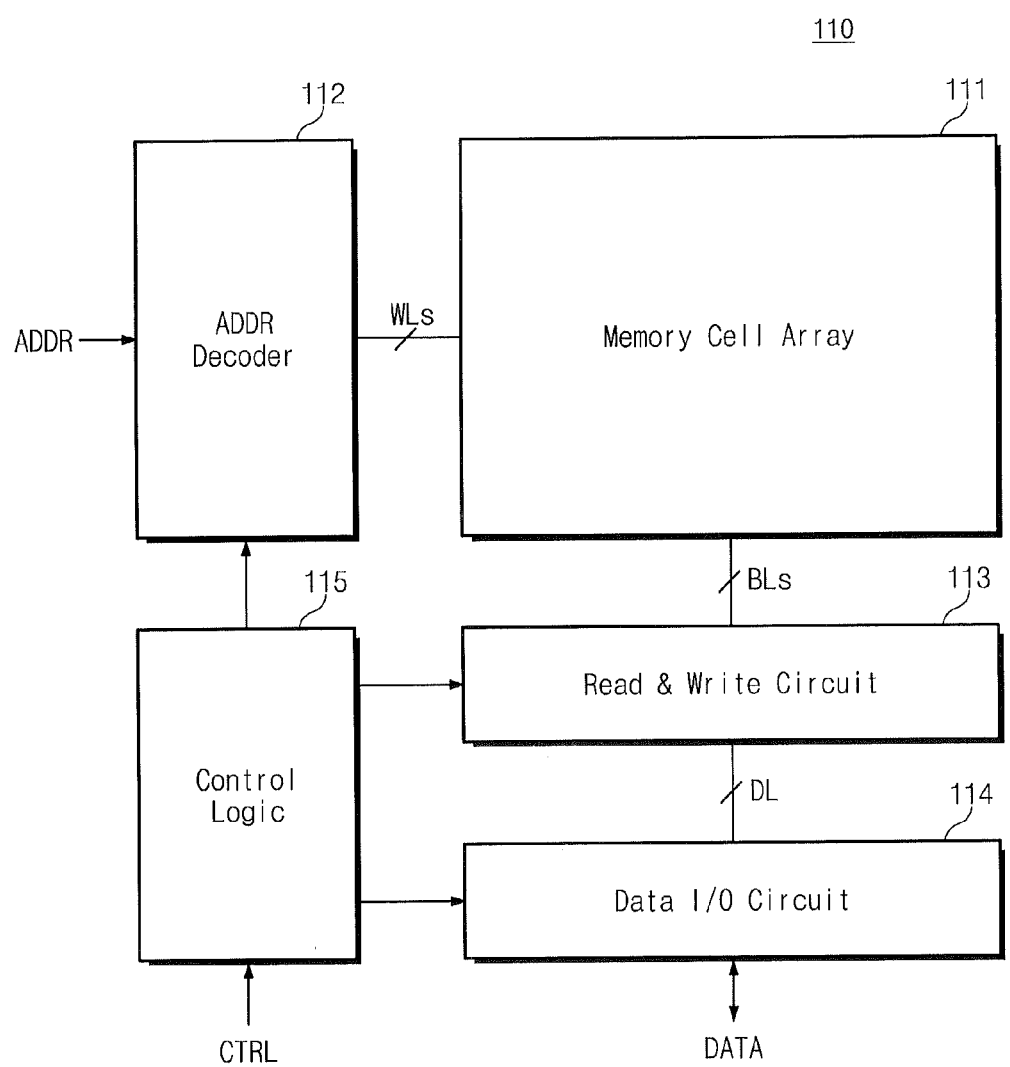
FIG. 8 is a block diagram schematically illustrating a first nonvolatile memory illustrated in FIG. 1, according to an embodiment of the inventive concept.

FIG. 8 is a block diagram schematically illustrating a first nonvolatile memory illustrated in FIG. 1, according to an embodiment of the inventive concept. It is assumed that a first nonvolatile memory 110 illustrated in FIG. 8 is a NAND flash memory. Referring to FIG. 8, the first nonvolatile memory 110 includes a memory cell array 111, an address decoder 112, a read/write circuit 113, a data input/output circuit 114, and control logic 115.

The memory cell array 111 is connected to the address decoder 112 through word lines and to the read/write circuit 113 through bit lines. The memory cell array 111 includes a plurality of memory cells. For example, memory cells arranged in a row direction may be connected to the word lines. Memory cells arranged in a column direction may be connected to the bit lines. The memory cells arranged in the column direction may form a plurality of cell groups (e.g., strings). The cell groups may be connected to the bit lines, respectively. In some embodiments, the memory cell array 111 may be configured to store one or more bits per cell.

The address decoder 112 is connected to the memory cell array 111 through the word lines. The address decoder 112 is configured to operate in response to a control of the control logic 115. The address decoder 112 receives an address ADDR from an external device.

The address decoder 112 is configured to decode a row address of the input address ADDR. The address decoder 112 selects the word lines using the decoded row address. The address decoder 112 is configured to decode a column address of the input address ADDR. In some embodiments, the address decoder 112 may include components such as a row decoder, a column decoder, an address buffer, etc.

The read/write circuit 113 is connected to the memory cell array 111 through the bit lines and to the data input/output circuit 114 through data lines. The read/write circuit 113 operates in response to a control of the control logic 115. The read/write circuit 113 is configured to receive the decoded column address from the address decoder 112. The read/write circuit 113 selects the bit lines in response to the decoded column address.

The read/write circuit 113 receives data from the data input/output circuit 114 to write it in the memory cell array 111. The read/write circuit 113 reads data from the memory cell array 111 to transfer it to the data input/output circuit 114.

The read/write circuit 113 may include components such as a page buffer (or, a page register), a column selection circuit, etc. Alternatively, the read/write circuit 113 may include components such as a sense amplifier, a write driver, a column selection circuit, etc.

The data input/output circuit 114 is connected to the read/write circuit 113 through the data lines. The data input/output circuit 114 operates in response to a control of the control logic 115. The data input/output circuit 114 is configured to exchange data with the external device. The data input/output circuit 114 is configured to transfer data provided from the external device to the read/write circuit 113 through the data lines. The data input/output circuit 114 is configured to output data transferred from the read/write circuit 113 through the data lines to the external device. In some embodiments, the data input/output circuit 114 may include components such as a data buffer, etc.

The control logic 115 is connected to the address decoder 112, the read/write circuit 113, and the data input/output circuit 114. The control logic 115 is configured to control an overall operation of the first nonvolatile memory 110. The control logic 115 operates in response to a control signal CTRL transferred from the external device.

Figure 9:
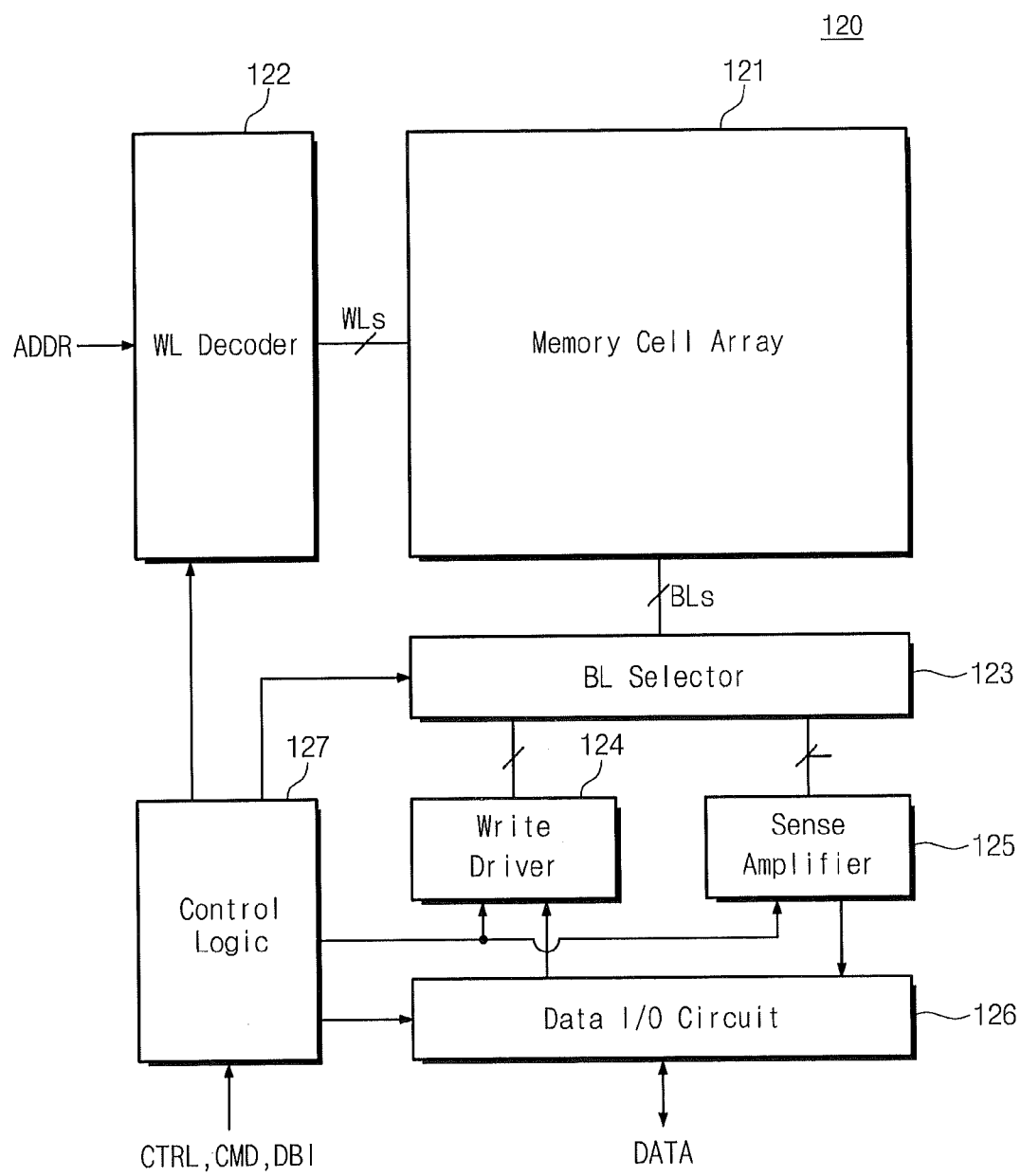
FIG. 9 is a block diagram schematically illustrating a second nonvolatile memory illustrated in FIG. 1, according to an embodiment of the inventive concept.

FIG. 9 is a block diagram schematically illustrating a second nonvolatile memory illustrated in FIG. 1, according to an embodiment of the inventive concept. It is assumed that a second nonvolatile memory 120 illustrated in FIG. 9 is a variable resistance random access memory. Here, the variable resistance random access memory may mean a random access memory that determines a program state of a memory cell by reading a resistance value between both ends of the memory cells. A resistance value read from the memory cell may be variable according to a program state of the memory cell, and the program state of the memory cell is decided according to a band to which the resistance value read belongs. The variable resistance random access memory may be a PRAM, an MRAM, a ReRAM, etc.

Referring to FIG. 9, the second nonvolatile memory 120 includes a memory cell array 121, a word line decoder 122, a bit line selector 123, a write driver 124, a sense amplifier 125, a data input/output circuit 126, and control logic 127.

The memory cell array 121 is connected to the word line decoder 122 through word lines and to the bit line selector 123 through bit lines. The memory cell array 121 includes a plurality of memory cells. In some embodiments, the memory cells of the memory cell array 121 may be resistive memory cells. For example, memory cells arranged in a row direction may be connected to the word lines. Memory cells arranged in a column direction may be connected to the bit lines. Each memory cell of the memory cell array 121, for example, may correspond to a word line and a bit line. Each memory cell of the memory cell array 121 may store one or more bits according to voltages or currents applied to a word line and a bit line.

In some embodiments, the memory cells of the memory cell array 121 may be PRAM cells or ReRAM cells.

The word line decoder 122 is connected to the memory cell array 121 through the word lines. The word line decoder 122 is configured to operate in response to a control of the control logic 127. The word line decoder 122 is configured to decode a row address of an address provided from an external device. The word line decoder 122 selects the word lines using the decoded row address.

The bit line selector 123 is connected to the memory cell array 121 through the bit lines and to the write driver 124 and the sense amplifier 125. The bit line selector 123 selects the bit lines in response to a control of the control logic 127. At a program operation, the bit line selector 123 connects the bit lines to the write driver 124. At a read operation, the bit line selector 123 connects the bit lines to the sense amplifier 125.

The write driver 124 operates in response to a control of the control logic 127. The write driver 124 is configured to program memory cells that are connected to bit lines selected by the bit line selector 123 and to a word line selected by the word line decoder 122. The write driver 124 generates a set current or a reset current (or, a set voltage or a reset voltage) according to data received through the data input/output circuit 126 and outputs them to the selected bit lines.

The sense amplifier 125 operates in response to a control of the control logic 127. The sense amplifier 125 is configured to read memory cells that are connected to bit lines selected by the bit line selector 123 and to a word line selected by the word line decoder 122. The sense amplifier 125 reads memory cells by sensing currents flowing through the selected bit lines or voltages applied to the selected bit lines. The sense amplifier 125 outputs the read data to the data input/output circuit 126.

The data input/output circuit 126 operates in response to a control of the control logic 127. The data input/output circuit 126 transfers data received from the external device to the write driver 124 and outputs data received from the sense amplifier 125 to the external device.

The control logic 127 controls an overall operation of the second nonvolatile memory 120. The control logic 127 operates in response to a command CMD and a control signal CTRL received from the external device.

Figure 10:
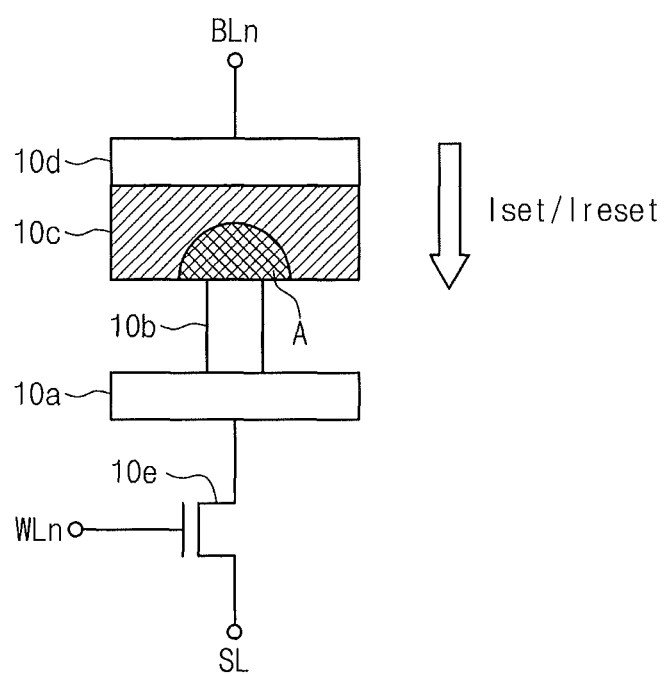
FIG. 10 is a diagram schematically illustrating a memory cell of a memory cell array illustrated in FIG. 9, according to an embodiment of the inventive concept.

FIG. 10 is a diagram schematically illustrating a memory cell of a memory cell array illustrated in FIG. 9, according to an embodiment of the inventive concept. It is assumed that a memory cell 10 of a memory cell array 121 (refer to FIG. 9) illustrated in FIG. 10 is a PRAM cell. Referring to FIG. 10, the memory cell 10 includes a storage element and a switch transistor 10e. The storage element includes a bottom electrode 10a, a phase transition layer 10c, a top electrode 10d, and a conductive plug 10b connecting the bottom electrode 10a and the top electrode 10d. The memory cell 10 is connected to a bit line BLn and a word line WLn.

An upper surface of the top electrode 10d is connected to a bit line terminal BLn, and a lower surface of the bottom electrode 10a is connected to a drain of the switch transistor 10e. A gate of the switch transistor 10e is connected to a word line terminal WLn, and the switch transistor 10e is turned on or off according to a level of a voltage applied to the word line terminal WLn. The memory cell 10 is selected or unselected according to a turn-on or turn-off of the switch transistor 10e. A source of the switch transistor 10e is connected to a source line terminal SL.

A resistance value between both ends (i.e., the bit line terminal BLn and the source line terminal SL) of the memory cell 10 is varied according to a crystal state of the phase transition layer 10c. A program state of the memory cell 10 is determined according to the varied resistance value between the both ends of the memory cell 10. For example, when the phase transition layer 10c is at a crystalline state, the resistance value between both ends of the memory cell 10 may become relatively small. At this time, there is determined that data '0' is programmed in the memory cell 10. On the other hand, when the phase transition layer 10c is at an amorphous state, the resistance value between both ends of the memory cell 10 may become relatively large. At this time, there is determined that data '1' is programmed in the memory cell 10.

A crystal state of the phase transition layer 10c is varied according to a set current or a reset current applied to the memory cell 10. In particular, when a phase of the phase transition layer 10c is at a crystalline state, a predetermined pulse current is applied to the bottom electrode 10a through the conductive plug 10b from the top electrode 10d as a reset current. In some embodiments, the reset current Ireset has a pulse duration of 30 ns and a current level of 1.6 mA. Since a width of the conductive plug 10b is considerably narrower than that of the phase transition layer 10c, the reset current Ireset is focused on an area A of the phase transition layer 10c contacting with the conductive plug 10b. Thus, a temperature of the area A is high enough to change a phase of a material forming the phase transition layer 10c in a moment, so that a phase of the area A is changed from a crystalline state to an amorphous state.

On the other hand, when a phase of the phase transition layer 10c is at an amorphous state, a predetermined pulse current is applied to the bottom electrode 10a through the conductive plug 10b from the top electrode 10d as a set current Iset. At this time, a flowing direction of the set current Iset is equal to that of the reset current Ireset. A duration of the set current Iset is longer than that of the reset current Ireset, while a current level of the set current Iset is lower than that of the reset current Ireset. While the set current Iset is being applied, the area A of the phase transition layer 10c on which the set current Iset is focused is changed from an amorphous state to a crystalline state.

Figure 11:
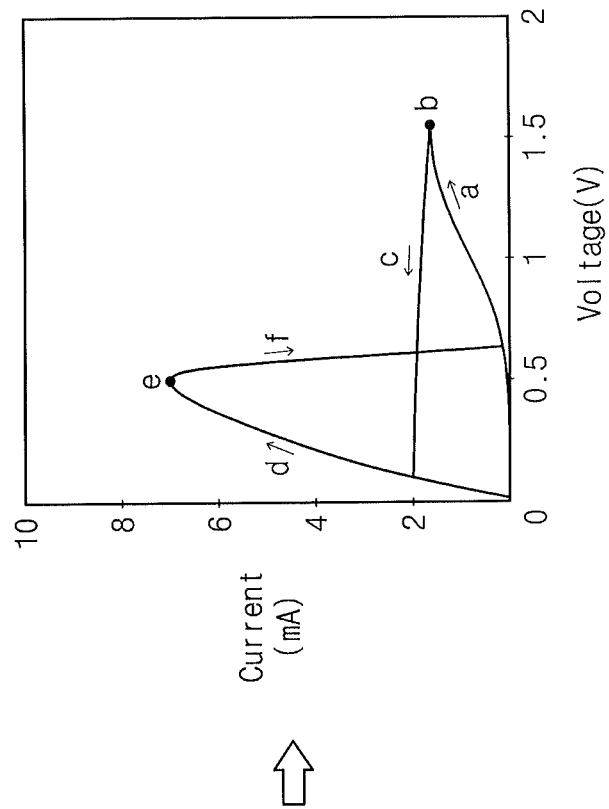
FIG. 11 is a diagram schematically illustrating a memory cell of a memory cell array illustrated in FIG. 9, according to another embodiment of the inventive concept.
Figure 11:
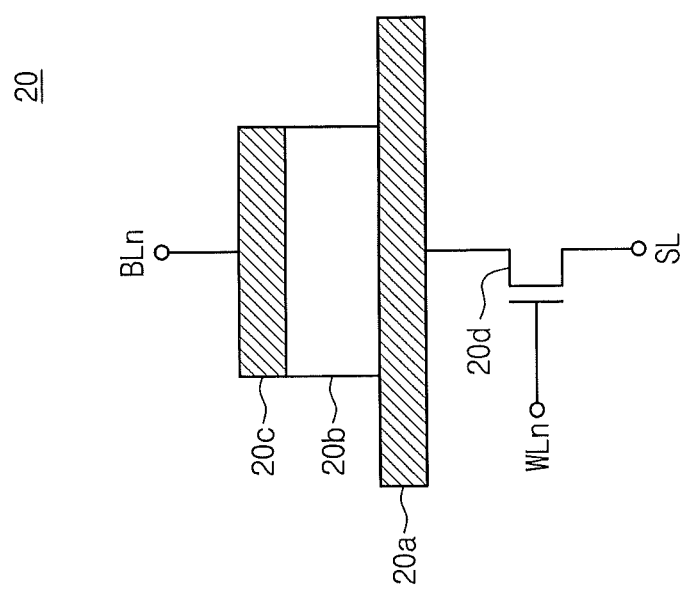

FIG. 11 is a diagram schematically illustrating a memory cell of a memory cell array illustrated in FIG. 9, according to another embodiment of the inventive concept. It is assumed that a memory cell of a memory cell array 121 (refer to FIG. 9) illustrated in FIG. 11 is a ReRAM cell. In the ReRAM cell, a current path is formed when a sufficiently high voltage is applied to an insulator material, and data is stored using such a phenomenon that a resistance value is decreased.

Referring to FIG. 11, the memory cell 20 includes a resistance variable element and a switch transistor 20d. The resistance variable element includes a bottom electrode 20a, a top electrode 20c, and an oxide film 20b interposed between the bottom electrode 20a and the top electrode 20c. The memory cell 20 is connected to a word line WLn and a bit line BLn.

An upper surface of the top electrode 20c is connected to a bit line terminal BLn, and a lower surface of the bottom electrode 20a is connected to a drain of the switch transistor 20d. A gate of the switch transistor 20d is connected to a word line terminal WLn. The switch transistor 20d is turned on or off according to a level of a voltage applied to the word line terminal WLn. The memory cell 20 is selected or unselected according to a turn-on or turn-off of the switch transistor 20d. A source of the switch transistor 20d is connected to a source line terminal SL.

When the switch transistor 20d is turned on, a resistance value of the memory cell 20 may be varied by controlling a current or a voltage applied to the resistance variable element including the bottom electrode 20a, the oxide film 20b, and the top electrode 20c. A state of the memory cell 20 is switched into one of a high resistance state and a low resistance state according to a current flowing into the memory cell 20 and a voltage applied between both terminals BLn and SL.

Below, a program method of the memory cell 20 is described with reference to a graph placed at a right side of FIG. 11.

When the memory cell 20 is at a high resistance state (a portion 'a'), a current flowing into the memory cell 20 increases in proportion to a voltage applied between both terminals BLn and SL, while a slope of a current increasing curve is relatively slow. If a voltage applied between both terminals BLn and SL is higher than a predetermined level (a portion 'b'), a resistance value of the memory cell 20 may sharply decrease. At this time, a second nonvolatile memory 120 (refer to FIG. 1) may include a limiter circuit (not shown) to prevent a current from flowing into the memory cell excessively. If a voltage applied to the memory cell 20 is higher than a predetermined level when the memory cell 20 is at the high resistance state (a portion 'a'), it is possible to make a resistance state of the memory cell 20 transition to a low resistance state (a portion 'c'). Meanwhile, the memory cell having the low resistance state transitions to the high resistance state (a portion 'f') when a level of a current flowing into the memory cell 20 is higher than a predetermined level (a portion e'). A transition from the high resistance state 'a' to the low resistance state 'd' is referred to as 'SET', and a transition from the low resistance state 'd' to the high resistance state 'a' is referred to as 'RESET'. The low resistance state d and the high resistance state of the memory cell 20 correspond to a program state of data '1' and a program state of data '0', respectively.

In a general ReRAM, when the memory cell 20 is at the low resistance state, a resistance value between both terminals BLn and SL of the memory cell 20 may be about several kΩ. On the other hand, when the memory cell 20 is at the high resistance state, a resistance value between both terminals BLn and SL of the memory cell 20 may be about several kΩ, to many kΩ. Thus, it is possible to determine a program state of the memory cell by reading a resistance value between both terminals BLn and SL of the memory cell 20.

Figure 12:
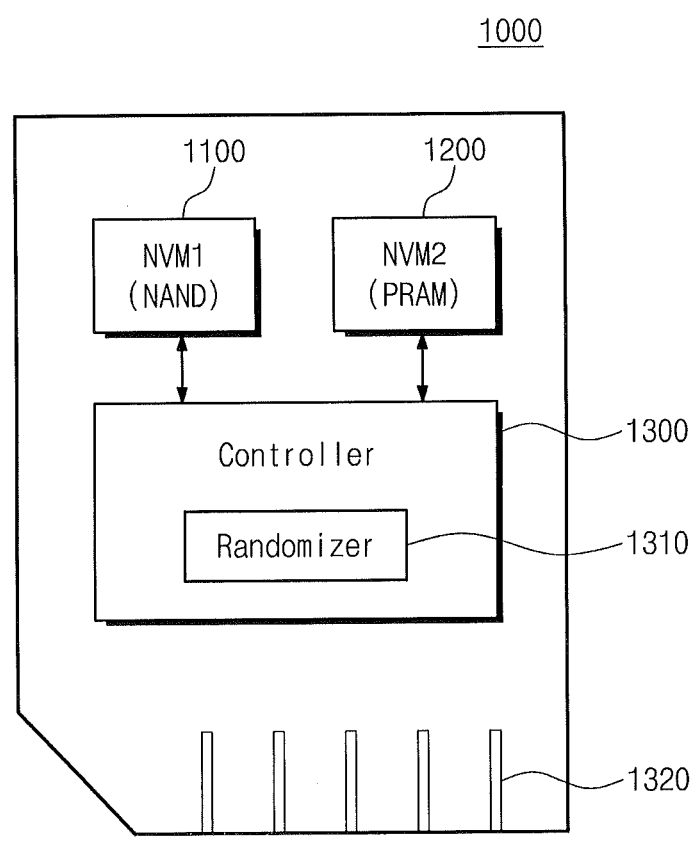
FIG. 12 is a block diagram schematically illustrating a memory card including a semiconductor memory device according to an embodiment of the inventive concept.

FIG. 12 is a block diagram schematically illustrating a memory card including a semiconductor memory device according to an embodiment of the inventive concept. Referring to FIG. 12, a memory card 1000 includes a first nonvolatile memory 1100, a second nonvolatile memory 1200, a controller 1300, and a connector 1320. The controller 1300 includes a randomizer 1310.

In some embodiments, the first and second nonvolatile memories 1100 and 1200, the controller 1300, and the randomizer 1310 are substantially the same as those illustrated in FIG. 1.

In FIG. 1, there is illustrated an embodiment where a semiconductor memory device 100 includes two different types of nonvolatile memories 110 and 120. However, the inventive concept is not limited thereto. For example, the semiconductor memory device 100 may further comprise a nonvolatile memory (not shown) that has the same type of that of the first nonvolatile memory 110 or the second nonvolatile memory 120.

A type of the second nonvolatile memory 1200 is different from that of the first nonvolatile memory 1100. For example, in the event that the first nonvolatile memory 1100 is a NAND flash memory, the second nonvolatile memory 1200 is a variable resistance random access memory such as a phase-change RAM, a resistive RAM, a magnetoresistive RAM, etc.

The controller 1300 controls the first and second nonvolatile memories 1100 and 1200. Also, the controller 1300 includes the randomizer 1310 configured to randomize write data to be programmed in the first or second nonvolatile memories 1100 or 1200.

The randomizer 1310 randomizes write data. Here, data randomization may mean that data bits are rearranged such that program states of memory cells to be programmed with data are uniformly distributed.

The connector 1320 electrically connects the memory card 1000 and a host.

The memory card 1000 according to an embodiment of the inventive concept randomizes write data using one, selected according to an attribute of the write data and a type of nonvolatile memory in which the write data is to be programmed, from among different randomization methods. Thus, a performance of randomization of the memory card 1000 is improved and the reliability is improved.

The detailed contents are not described in connection with the controller 1300 as the randomizer 1310 and a data randomization method using the same is substantially the same as described with reference to FIGS. 1 to 8.

The memory card 1000 may be a memory card such as a PC card, a compact flash card, a smart media card, a memory stick, a multimedia card, an SD card, a universal flash storage device, etc.

Figure 13:
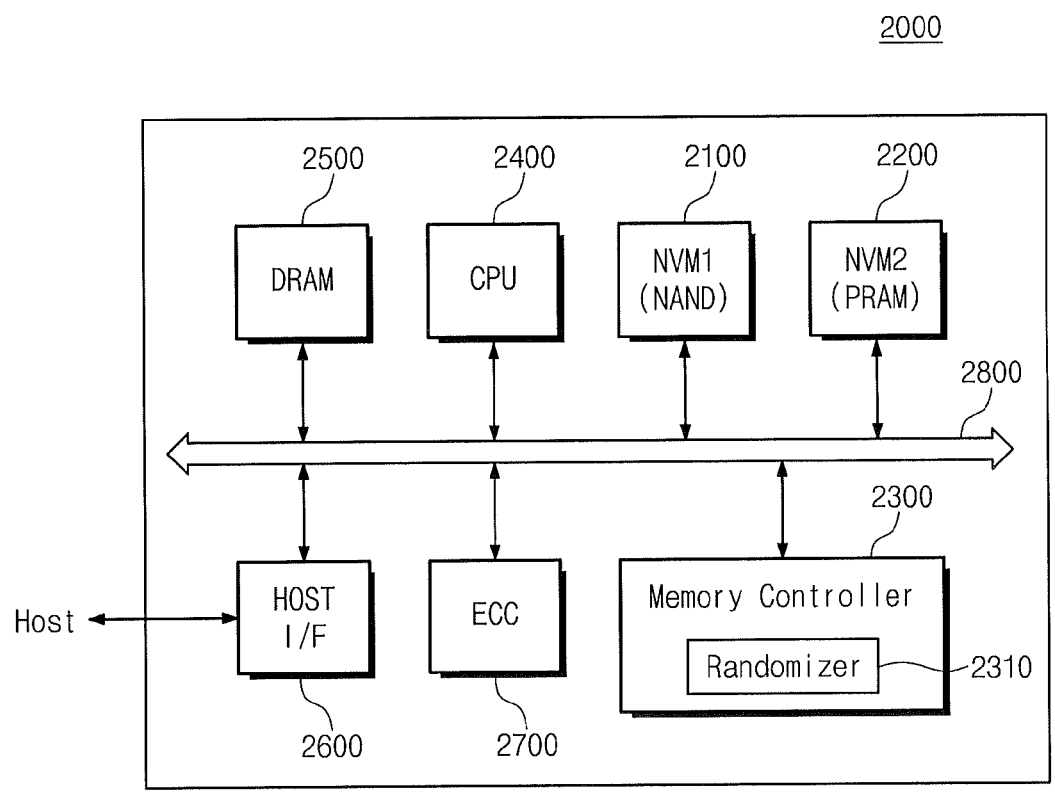
FIG. 13 is a block diagram schematically illustrating a memory system to which a semiconductor memory device according to an embodiment of the inventive concept is applied.

FIG. 13 is a block diagram schematically illustrating a memory system to which a semiconductor memory device according to an embodiment of the inventive concept is applied. Referring to FIG. 13, a memory system 2000 includes a first nonvolatile memory 2100, a second nonvolatile memory 2200 having a type different from that of the first nonvolatile memory 2100, and a memory controller 2300. The memory controller 2300 includes a randomizer 2310.

In some embodiments, the first and second nonvolatile memories 2100 and 2200, the controller 2300, and the randomizer 2310 are substantially the same as those illustrated in FIG. 1.

A type of the second nonvolatile memory 2200 is different from that of the first nonvolatile memory 2100. For example, the first nonvolatile memory 2100 is a NAND flash memory, and the second nonvolatile memory 2200 is a variable resistance random access memory such as a phase-change RAM, a resistive RAM, a magnetoresistive RAM, etc.

The memory controller 2300 controls the first and second nonvolatile memories 2100 and 2200. The randomizer 2310 of the memory controller 2300 randomizes write data based on a provided seed. A DRAM 2500 is used as a working memory of a CPU 2400. The CPU 2400 performs an overall control operation for data exchange of the memory controller 2300. A host interface 2600 may include the data exchange protocol of a host connected to the memory system 2000. Although not shown, the memory system 2000 may further comprise a ROM that stores code data for an interface with the host.

The memory controller 2300 is configured to communicate with an external device (e.g., a host) through one of interface protocols such as USB, MMC, PCI-E, SAS, SATA, PATA, SCSI, ESDI, IDE, etc.

The memory system 2000 according to an embodiment of the inventive concept randomizes write data using at least one method selected from among different randomization methods according to an attribute of the write data and a type of nonvolatile memory in which the write data is to be programmed. Thus, a performance of randomization of the memory system 2000 is improved and its reliability is improved.

The detailed contents not described in connection with the memory controller 2300, the randomizer 2310 and a data randomization method using the same is substantially the same as described with reference to FIGS. 1 to 8.

As another example, the memory system 2000 may be applied to one of various components of an electronic device such as a computer, a ultra-mobile personal computer (UMPC), a workstation, a net-book, a personal digital assistance (PDA), a portable computer (PC), a web tablet, a wireless phone, a mobile phone, a smart phone, a smart television, a three-dimensional television, an e-book, a portable multimedia player (PMP), a portable game console, a navigation device, a black box, a digital camera, a digital multimedia broadcasting (DMB) player, a digital audio recorder, a digital audio player, a digital picture recorder, a digital picture player, a digital video recorder, a digital video player, a device for transmitting and receiving information in a wireless environment, and one of various electronic devices constituting a home network.

Figure 14:
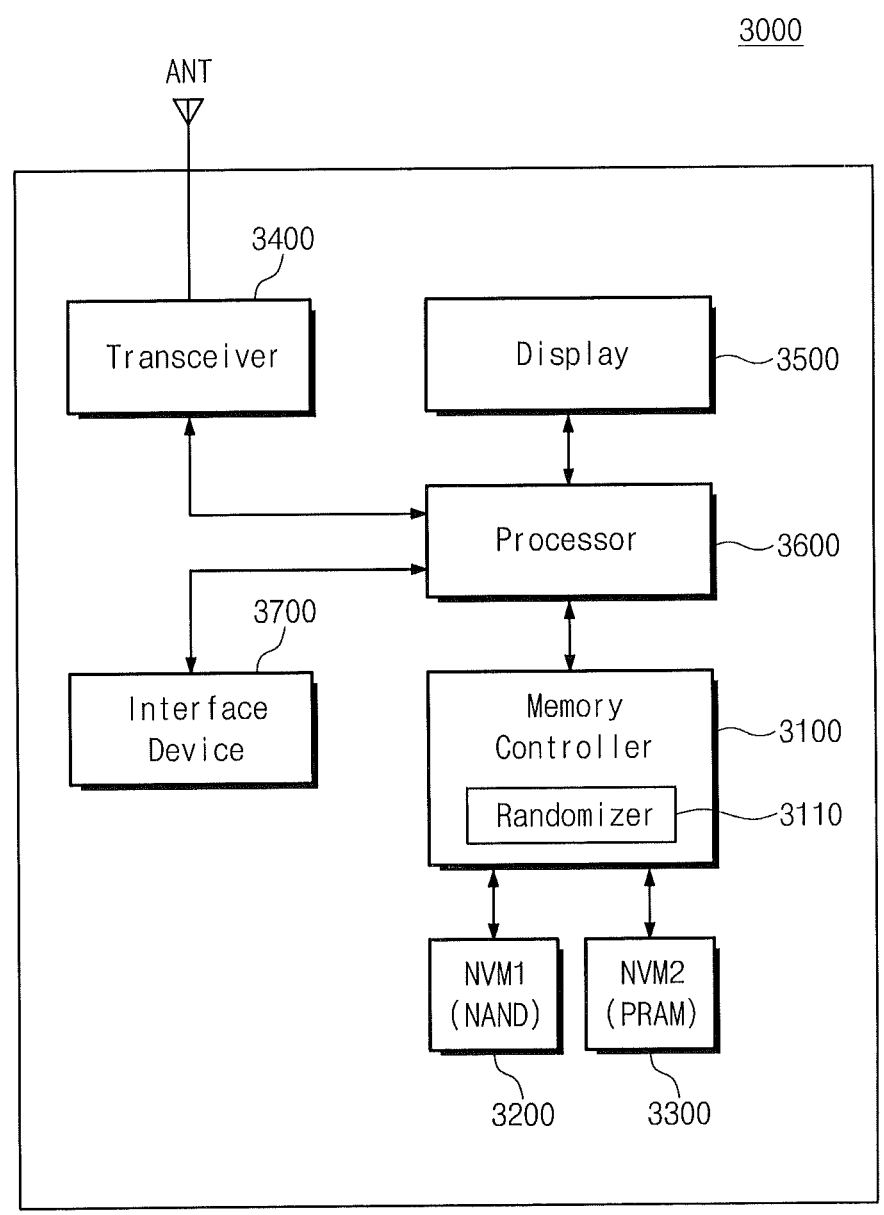
FIG. 14 is a block diagram schematically illustrating a mobile electronic device to which a semiconductor memory device according to an embodiment of the inventive concept is applied.

FIG. 14 is a block diagram schematically illustrating a mobile electronic device to which a semiconductor memory device according to an embodiment of the inventive concept is applied. In some embodiments, a mobile electronic device 3000 may be a cellular phone, a smart phone, or a tablet PC. Referring to FIG. 14, the mobile electronic device 3000 includes a first nonvolatile memory 3200, a second nonvolatile memory 3300 having a type different from that of the first nonvolatile memory 3200, and a memory controller 3100 controlling the first and second nonvolatile memories 3200 and 3300. The memory controller 3100 includes a randomizer 3110.

In some embodiments, the first and second nonvolatile memories 3200 and 3300, the memory controller 3100, and the randomizer 3110 are substantially the same as those illustrated in FIG. 1.

The first nonvolatile memory 3200 and the second nonvolatile memory 3300 store write data in response to a control of the memory controller 3100. For example, the first nonvolatile memory 3200 is a NAND flash memory, and the second nonvolatile memory 3300 is a variable resistance random access memory such as a phase-change RAM, a resistive RAM, a magnetoresistive RAM, etc.

The memory controller 3100 controls the first nonvolatile memory 3200 and the second nonvolatile memory 3300. The randomizer 3110 of the memory controller 3100 randomizes write data to be programmed in the first nonvolatile memory 3200 and the second nonvolatile memory 3300, based on a provided seed.

The mobile electronic device 3000 according to an embodiment of the inventive concept randomizes write data using at least one method selected from among different randomization methods according to an attribute of the write data and a type of nonvolatile memory in which the write data is to be programmed. Thus, a performance of randomization of the mobile electronic device 3000 is improved and its reliability is improved.

The detailed contents not described in connection with the memory controller 3100, the randomizer 3110 and a data randomization method using the same is substantially the same as described with reference to FIGS. 1 to 8.

A processor 3600 controls components of the mobile electronic device 3000 including the memory controller 3100.

A display 3500 displays image data according to a control of the processor 3600. For example, the display 3500 displays a still image or a moving picture based on a command and image data provided from the processor 3600.

A wireless transceiver 3400 transmits and receives a wireless signal through an antenna ANT. For example, the wireless transceiver 3400 converts a wireless signal received through the antenna ANT into an electrical signal suitable for processing of the processor 3600. At this time, the processor 3600 performs multiple steps on a signal output from the wireless transceiver 3400 and controls the memory controller 3100 and the display 3500 such that the processed signal is stored or displayed. Alternatively, the wireless transceiver 3400 converts an electrical signal output from the processor 3600 into a wireless signal and transmits it to an external device through the antenna ANT.

An interface device 3700 receives a control signal for controlling an operation of the processor 3600 or data to be processed by the processor 3600. In some embodiments, the interface device 3700 may include a touch pad, a computer mouse, a keypad, a keyboard, a pointing device, etc.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A data programming method of a semiconductor memory device, comprising:
    randomizing write data using at least one randomization method selected from among a plurality of randomization methods; and
    programming corresponding to the selected at least one randomization method, the randomized write data in at least one of the plurality of nonvolatile memories,
    wherein randomized write data that is based on a same randomization method is programmed in a same type of nonvolatile memory.

2. The data programming method of claim 1, wherein each of the randomization methods generates random sequences using randomizers having different degrees.

3. The data programming method of claim 1, wherein each of the randomization methods uses different seed generating methods to generate a seed for data to be randomized.

4. The data programming method of claim 1, wherein the at least one of the plurality of nonvolatile memories is programmed in minimum program units and a minimum program unit used to program the randomized write data in the at least one of the plurality of nonvolatile memories depends on a type of the at least one nonvolatile memory to be programmed with the randomized write data.

5. The data programming method of claim 4, wherein the plurality of nonvolatile memories comprises a variable resistance random access memory configured to determine data stored in a memory cell by reading a resistance value between both ends of the memory cell.

6. The data programming method of claim 5, wherein the variable resistance random access memory is a phase-change random access memory.

7. The data programming method of claim 4, wherein the plurality of nonvolatile memories comprises a NAND flash memory.

8. A data programming method of a semiconductor memory device that includes different types of first and second nonvolatile memories, the data programming method comprising:
    randomizing first write data using at least one randomization method selected from among a plurality of randomization methods according to an attribute of the first write data to be programmed in the first nonvolatile memory or according to a type of the first nonvolatile memory; and
    programming the randomized first write data in the first nonvolatile memory,
    wherein second write data to be programmed in the second nonvolatile memory is randomized using a predetermined randomization method of the plurality of randomization methods.

9. The data programming method of claim 8, wherein the randomizing comprises:
    randomizing the first write data using the randomization method, different from the predetermined randomization method, from among the plurality of randomization methods when the first write data has an attribute of metadata.

10. The data programming method of claim 8, wherein the randomizing comprises:

randomizing the first write data using the predetermined randomization method when the first write data has an attribute of buffer data, and wherein the buffer data is data that is temporarily stored in the first nonvolatile memory to move the first write data to the second nonvolatile memory.

11. The data programming method of claim 8, wherein each of the randomization methods generates random sequences using randomizers having different degrees.

12. The data programming method of claim 8, wherein each of the randomization methods uses different seed generating methods to generate a seed for data to be randomized.

13. The data programming method of claim 8, wherein the first nonvolatile memory is a variable resistance random access memory configured to determine data stored in a memory cell by reading a resistance value between both ends of the memory cell.

14. The data programming method of claim 9, wherein the first nonvolatile memory is a phase-change random access memory.

15. The data programming method of claim 9, wherein the second nonvolatile memory comprises a NAND flash memory.

16. A data programming method of a semiconductor memory device, comprising:

when first write data is programmed in a first nonvolatile memory having a first minimum programming unit,
randomizing the first write data using a first randomization method selected from among a first plurality of randomization methods configured for nonvolatile memories with the first minimum programming unit; and
programming the randomized first write data in the first nonvolatile memory; and when second write data is programmed in a second nonvolatile memory having a second minimum programming unit lower than the first minimum programming unit,
randomizing the second write data using a second randomization method selected from among a second plurality of randomization methods configured for nonvolatile memories with the second minimum programming unit; and
programming the randomized second write data in the second nonvolatile memory.

17. The data programming method of claim 16, wherein the first plurality of randomization methods generates random sequences using randomizers having a higher degree than randomizers of the second plurality of randomization methods, wherein a degree of a randomizer corresponds to a number of circularly connected shift registers of the randomizer.

18. The data programming method of claim 17, further comprising generating a seed of a randomizer of the second plurality of randomization methods based on a combination of column and row addresses of the second write data.

19. The data programming method of claim 16, wherein the first nonvolatile memory comprises a NAND flash memory, and wherein the second nonvolatile memory comprises a variable resistance random access memory configured to determine data stored in a memory cell by reading a resistance value between both ends of the memory cell.

20. The data programming method of claim 19, wherein the second nonvolatile memory is at least one of a magnetic random access memory (MRAM), phase-change random access memory (PRAM) and resistive random access memory (ReRAM).

* * * * *